Sept. 6, 1966 A. C. PRIOR 3,271,628
SUPERCONDUCTIVE CIRCUIT ARRANGEMENTS
Filed May 20, 1963 2 Sheets-Sheet 1

Inventor
Arthur Cunningham Prior
By
Cushman, Darby & Cushman
Attorneys

Sept. 6, 1966 A. C. PRIOR 3,271,628

SUPERCONDUCTIVE CIRCUIT ARRANGEMENTS

Filed May 20, 1963

2 Sheets-Sheet 2

INVENTOR
Arthur Cunningham Prior

BY
Cushman, Darby & Cushman
ATTORNEYS

United States Patent Office 3,271,628
Patented Sept. 6, 1966

3,271,628

SUPERCONDUCTIVE CIRCUIT ARRANGEMENTS

Arthur Cunningham Prior, Malvern, England, assignor to National Research Development Corporation, London, England Filed May 20, 1963, Ser. No. 281,450
Claims priority, application Great Britain, May 22, 1962, 19,650/62; Aug. 21, 1962, 32,030/62
10 Claims. (Cl. 317—123)

Figure 1:
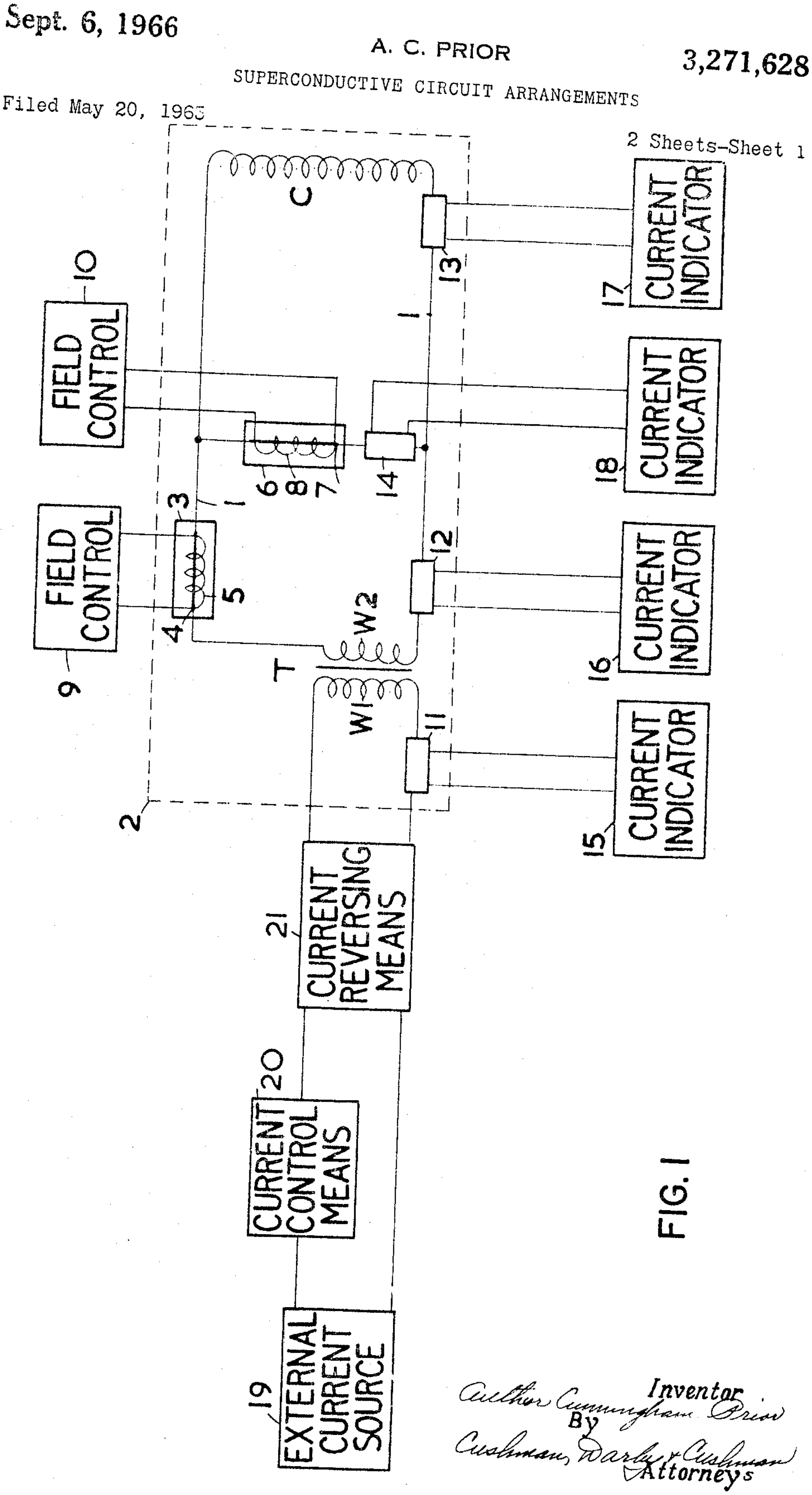

This invention relates to superconductive circuits and has reference to arrangements for providing enhanced circulating currents in a superconductive circuit.

In low temperature research or in the study or use of superconductive material it is sometimes desirable to use large circulating currents in closed superconducting circuits. These circuits, as is well known, operate at very low temperature and large currents cannot conveniently be introduced into the cooled part of the apparatus by conventional means because excessive heat is generated electrically in the leads if they are not of large area and, if they are, it is conducted along them.

This invention concerns a method of producing enhanced circulating currents in a superconductive circuit without the need for large area current-carrying leads and has reference to production of a large current in a superconductive solenoid.

According to the invention a method of producing enhanced circulating currents in a superconductive circuit comprises the steps of connecting the superconductive circuit in series with a second superconductive circuit, inducing a circulating current in the first and second circuits in series by means of inducing means coupled thereto, localising induced currents in the first and second circuits by short circuiting the first and second circuits with a superconductive link, rendering the second circuit non-superconductive to permit readjustment of the inducing means, restoring the second circuit to its superconductive state, rendering the superconductive link non-superconductive and, inducing a further current in the two circuits in series to aid the circulating current remaining after the short-circuit current has ceased to flow.

Additional steps may be added in which before rendering the second circuit and the short-circuiting link non-superconductive the currents therein are reduced by use of the inducing means. These steps give additional advantages, e.g., conservation of liquid helium.

The steps are repeated to increase, step-by-step, the circulating current in the first circuit.

According to the invention in another aspect an apparatus for producing enhanced circulating currents in a superconducting circuit comprises first and second superconductive circuits connected in series, means for breaking the series connection in the second circuit, means for short circuiting the two circuits simultaneously, and means for inducing currents in the second circuit.

In order to take advantage of the method a superconductive solenoid is envisaged, the windings of which are composed of large cross-sectional area conductors and the material of the windings is a superconductive material. The winding could be made by assembling flat spiral coils to form a large solenoid. The material of the coils would be typically $Nb_3Sn$ formed by sintering of powder packed into refractory molds in the form required, the sintering being formed at appropriate stages of assembly of the complete solenoid and circuit. Alternatively, the solenoid may be built up from a number of concentric helical coils of the packed powder.

To make the invention clearer an example of an apparatus for producing enhanced circulating currents in a superconductive circuit, according to the invention will now be described together with a method of use. Reference will be made to the drawings accompanying this specification in which the FIGURES 1 and 2 show alternative circuit arrangements of apparatus according to the invention.

Figure 2:
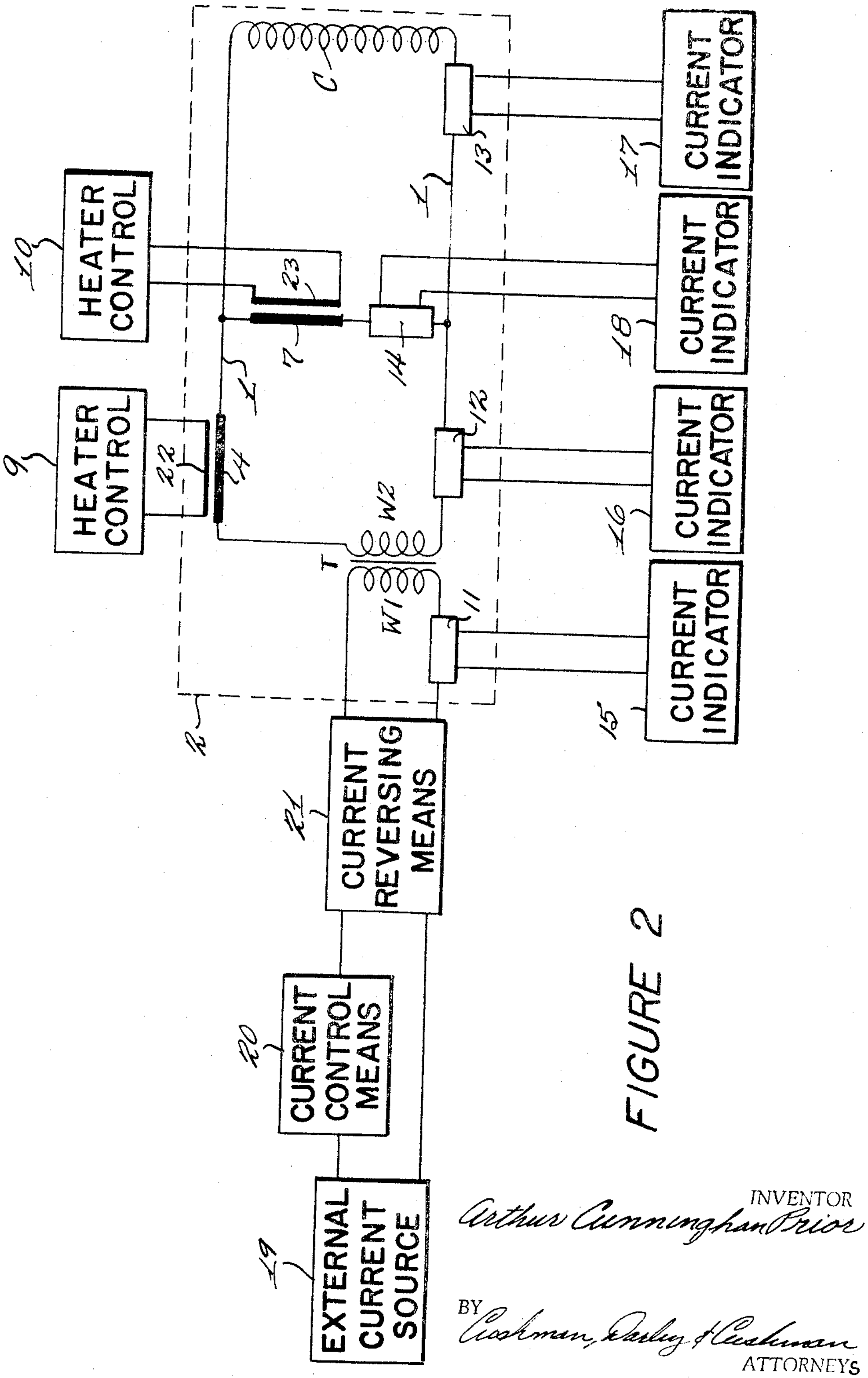

In FIGURE 1, a transformer T having superconductive windings W1 and W2 is connected at its secondary winding W2 to a superconducting solenoid C by superconductive connectors 1. The transformer T, the solenoid C and their superconductive connectors 1 are contained within a cooled container 2 indicated generally by enclosing chain lines.

A first switch 3 conveniently consisting of a length of superconductive wire or wires located within a control solenoid 5, is connected in series with one of the connectors 1. A second switch 6, conveniently consisting of a length 7 of superconductive wire or wires located within a control solenoid 8, is connected across the solenoid C. Field control circuits 9 and 10 are respectively connected to the control solenoids 5 and 8.

Current measuring devices are located in various parts of the circuit to indicate the currents therein. For simplicity devices are shown schematically at 11, 12, 13 and 14 connected respectively in series with the primary winding W1, in series with the secondary winding W2, in series with the solenoid C, and in series with the switch 6, and they feed current indicators 15, 16, 17 and 18 again respectively.

An external current source 19 is coupled to the primary winding W1 of the transformer T via a current control means 20 and a current reversing means 21.

In operation of the apparatus of FIGURE 1 the solenoids 5 and 8 are energized by their field control circuits 9 and 10; thus the superconductive wire 4 is rendered non-superconducting (i.e., non-zero resistance and the switch 3 is open) and the series superconductive circuit of the winding W2 and the solenoid C is effectively broken: and the superconductive wire 7 is rendered non-superconducting (i.e., non-zero resistance and the switch 6 is open) so that the shunt switch 6 is not short-circuiting the solenoid C.

The current control means 20 is adjusted so that a maximum current flows through the winding W1 from the external current source 19.

The switch 3 is closed by de-energizing the solenoid 5; the switch 6 is left open. The current in the winding W1 is now reversed by operation of the current control means 20 and the current reversing means 21 and a persistent current commences to flow through the secondary winding W2, the switch 3 and the solenoid C; the current is then reversed by reducing smoothly or in small steps to zero, reversing and then increasing in the opposite direction.

The switch 6 is now closed by de-energizing the solenoid 8 which is under the control of the control circuit 10 and, by operation of the control means 20, the current in the winding W1 is changed until the current through the switch 3 becomes zero and that through the switch 6 is equal to the current through the solenoid C.

The switch 3 is opened leaving the switch 6 closed and the current through the winding W1 is adjusted to a maximum operating value in the same direction as it was in the first instance with both switches 3 and 6 open.

The switch 3 is now closed again and the current through the winding W1 adjusted until the current through the switch 6 becomes zero.

The switch 6 is then opened and the current through the winding W1 changed to a maximum operating value, this time in the direction in which current was flowing after the current reversing means was operated with the switch 3 closed and the switch 6 open. This action results in an increase of the current circulating in the winding W2 and the solenoid C.

Subsequently the steps of the process may be repeated from after the point where the persistent current is established in the winding W2, the switch 3 and the solenoid C; the current increases step-wise until a desired current is flowing in the solenoid C.

The full sequence of operations described in the proceeding paragraphs ensures, inter alia, the conservation of cooling fluid, e.g., liquid helium, in the cooled container 2. Where this consideration is not important however the different steps by which the currents through the switch 3 and the switch 6 are reduced may be omitted without affecting the current enhancing action of the operation.

In the foregoing description the elements 4 and 7 of the switches 3 and 6, respectively, are switched to the non-superconductive state by application of magnetic fields generated by solenoids 5 and 8, respectively. In an alternative method illustrated in FIGURE 2, the elements 4 and 7 could be switched to the non-superconductive state by raising their temperature to a value above the critical temperature of the superconductor of which they are constructed. In this method the control solenoids 5 and 8 are replaced by lengths 22 and 23 of electrical resistance wire in close proximity to the elements 4 and 7, respectively, and these are insulated thermally from the cooling medium in the container 2 so as to give a convenient thermal time constant for operation of the switch. The operation of the switches in this manner will be accompanied by some power dissipation into the cooled container 2 but detailed consideration indicates that this need not be unreasonably large. The lengths 22 and 23 of resistance wire may be controlled by heater control units 24 and 25, respectively.

The resistance of the switches 3 and 6 in the open (non-superconductive) state is of the order of 0.001 ohm.

The measuring devices 11, 12, 13 and 14 are conveniently magneto resistance or Hall effect devices.

The maximum current that can be built up in the solenoid C is that current which flowing through the winding W2 would cause a magnetic flux linking the winding W2 equal to that produced by the maximum operating current through the winding W1. By suitable choice of design parameters the maximum circulating current can be made arbitrarily large.

If the switches 3 and 6 do not have infinite resistance when open, power will be dissipated in these switches during the steps described above. The energy dissipated can be made arbitrarily small by making the current changes through the winding W1 sufficiently slowly. Detailed consideration of practical situations indicate that the time taken for such current charges need not be inconveniently long.

The switch elements 4 and 7 may be made up of bundles of niobium wires (300 say 0.003 in dia. 19.5 in. long in parallel).

The primary winding W1 of the transformer T is conveniently made of a superconductive material to keep the dissipation low, but this is not essential. It should have a large number of turns to keep the current through the external supply leads to a low value. The winding W2 should, of course, be superconductive. The transformer T may or may not have a magnetic core depending on other circuit parameters.

The connectors 1 may be bundles of niobium wires (typically 300 in parallel) or sintered bars of $Nb_3Sn$.

The method of increasing stepwise the current in the solenoid C is expected to have advantages where windings of $Nb_3Sn$ are formed by sintering of powder packed directly into the form of the windings. Such windings would have a conductor cross-section of large area and very large currents of the order of 1,000–3,000 amps. would be appropriate.

The windings could be made by assembling flat spiral coils made by sintering; alternatively layer wound solenoids could be fabricated.

It is anticipated that the operation of the apparatus may be made partially or wholly automatic by the use of suitable automatic sequence switches controlling the switches 3 and 6 and interconnected with the control means 20, the reversing means 21 and the outputs of the current indicating means 15, 16, 17 and 18.

I claim:

1. A method of producing enhanced circulating currents in a superconductive circuit comprises the steps of connecting the superconductive circuit in series with a second superconductive circuit, inducing a circulating current in the first and second circuits in series by means of inducing means coupled thereto, localising induced currents in the first and second circuits by short circuiting the first and second circuits with a superconductive link, rendering the second circuit non-superconductive to permit readjustment of the inducing means, restoring the second circuit to its superconductive state, rendering the superconductive link non-superconductive and, inducing a further current in the two circuits in series to aid the circulating current remaining after the short-circuit current has ceased to flow.

2. A method as claimed in claim 1, wherein additional steps are carried out using the inducing means to reduce the currents in the second circuit and the short-circuiting link before rendering them non-superconductive.

3. An apparatus for producing enhanced circulating currents in a superconductive circuit comprising first and second superconductive circuits connected in series, means for breaking the series connection in the second circuit, means for short circuiting the two circuits simultaneously, and means for inducing currents in the second circuit, said inducing means being separate from said breaking means.

4. An apparatus as claimed in claim 3, wherein the means for breaking the series connection in the second circuit and the short-circuiting means comprise magnetically operated superconductive circuit elements.

5. An apparatus for producing enhanced circulating currents in a superconductive circuit comprising first and second superconductive circuits connected in series, means for rendering the second circuit non-superconductive, means for short-circuiting the two circuits simultaneously, and means for inducing currents in the second circuit, said inducing means being separate from said rendering means.

6. An apparatus as claimed in claim 5, wherein the means for rendering the second circuit non-superconductive and the short-circuiting means comprise superconductive circuit elements and associated heaters for rendering them non-superconductive.

7. An apparatus as claimed in claim 5, wherein the short-circuiting means is bridged across common series connection points of the two circuits.

8. An apparatus as claimed in claim 7, wherein the means for rendering the second circuit non-superconductive is connected between one termination of the second circuit and its associated common series connection point with the first circuit.

9. An apparatus as claimed in claim 5, wherein the means for inducing currents in the second circuit comprises a transformer having its secondary connected in the second circuit and at least the secondary being wound with superconductive material.

10. Apparatus as claimed in claim 9, wherein the transformer primary is wound with superconductive material.

References Cited by the Examiner

UNITED STATES PATENTS

| | | | |
|---|---|---|---|
| 3,096,431 | 7/1963 | Schmidlin | 340—173.1 X |
| 3,150,291 | 9/1964 | Laquer | 317—123 |

OTHER REFERENCES

IBM Technical Disclosure Bulletin, vol. 3, No. 7, December 1960, pp. 38–39; Anderson, Stored Current Bias.

MILTON O. HIRSHFIELD, *Primary Examiner.*

IRVING L. SRAGOW, SAMUEL BERNSTEIN, *Examiners.*

R. G. LITTON, D. YUSKO, J. A. SILVERMAN, *Assistant Examiners.*